US012757349B1

(12) United States Patent
Abdel-Dayem et al.

(10) Patent No.: US 12,757,349 B1
(45) Date of Patent: Oct. 6, 2026

(54) CABLE CARTRIDGE WITH ADJUSTABLE CONNECTORS

(71) Applicant: Amazon Technologies, Inc., Seattle, WA (US)

(72) Inventors: Bassam Abdel-Dayem, Milpitas, CA (US); Nafea Bshara, San Jose, CA (US); Kenny Kiet Huynh, Lynnwood, WA (US)

(73) Assignee: Amazon Technologies, Inc., Seattle, WA (US)

( * ) Notice: Subject to any disclaimer, the term of this patent is extended or adjusted under 35 U.S.C. 154(b) by 115 days.

(21) Appl. No.: 18/980,196

(22) Filed: Dec. 13, 2024

(51) Int. Cl.
*H05K 7/14* (2006.01)

(52) U.S. Cl.
CPC .................................. *H05K 7/1489* (2013.01)

(58) Field of Classification Search
CPC ...... H05K 7/14; H05K 7/1401; H05K 7/1411; H05K 7/1421; H05K 7/1438; H05K 7/1452; H05K 7/1454; H05K 7/1485; H05K 7/1488; H05K 7/1489; H01R 13/6315
See application file for complete search history.

(56) References Cited

U.S. PATENT DOCUMENTS

| | | | | | |
|---|---|---|---|---|---|
| 4,179,724 | A * | 12/1979 | Bonhomme | H05K 1/14 | 361/802 |
| 4,802,861 | A * | 2/1989 | Gaston | H01R 13/631 | 439/247 |
| 6,406,210 | B1 * | 6/2002 | Parrish | F16B 5/02 | 411/107 |
| 6,435,891 | B1 * | 8/2002 | Beck, Jr. | H01R 13/6315 | 439/364 |
| 6,549,400 | B1 * | 4/2003 | Medin | H05K 7/1454 | 439/62 |
| 6,927,974 | B2 * | 8/2005 | Robillard | H01R 13/6315 | 439/246 |
| 7,365,964 | B2 * | 4/2008 | Donahue, IV | H01R 13/514 | 439/55 |
| 9,335,786 | B2 * | 5/2016 | Stewart | G06F 1/16 | |
| 9,678,544 | B2 * | 6/2017 | Stewart | H05K 7/1489 | |
| 9,826,655 | B1 * | 11/2017 | Di Ricco Kurzava | G06F 1/18 | |
| 11,177,618 | B1 * | 11/2021 | Tunks | H05K 7/1492 | |
| 11,483,944 | B1 * | 10/2022 | Mahdi Hayder | H05K 5/0221 | |
| 11,509,079 | B2 * | 11/2022 | Tsai | H01R 12/7005 | |

* cited by examiner

*Primary Examiner* — Adrian S Wilson
(74) *Attorney, Agent, or Firm* — Kilpatrick Townsend & Stockton LLP

(57) ABSTRACT

A system can include a cartridge for installation within an interior volume of a rack. The cartridge can include an elongate rigid body. Connector bodies may be arranged along the elongate rigid body and sized for engagement with the aligned port bodies of appliances to be arranged in the rack. An adjustable assembly may be coupled with at least one connector body and include a set of one or more fasteners adjustable to adjust a position of the at least one connector body relative to the elongate rigid body.

20 Claims, 4 Drawing Sheets

CABLE CARTRIDGE WITH ADJUSTABLE CONNECTORS

BACKGROUND

Datacenters house collections of servers and networking hardware, including switches and routers. Many different cabled connections between components may be used to, for example, permit data or power transfer between the components. The manner in which cables are managed can become a significant factor in datacenter operations, especially as any excess cabling can have corresponding costs to supply, install, and/or maintain. In addition, cables and/or accompanying structures to guide, retain, route, or otherwise manage cables can occupy significant amounts of space and thus reduce total space that can be available for components that contribute computing power within a datacenter.

BRIEF DESCRIPTION OF THE DRAWINGS

Various embodiments in accordance with the present disclosure will be described with reference to the drawings, in which.

DETAILED DESCRIPTION

Figure 1:
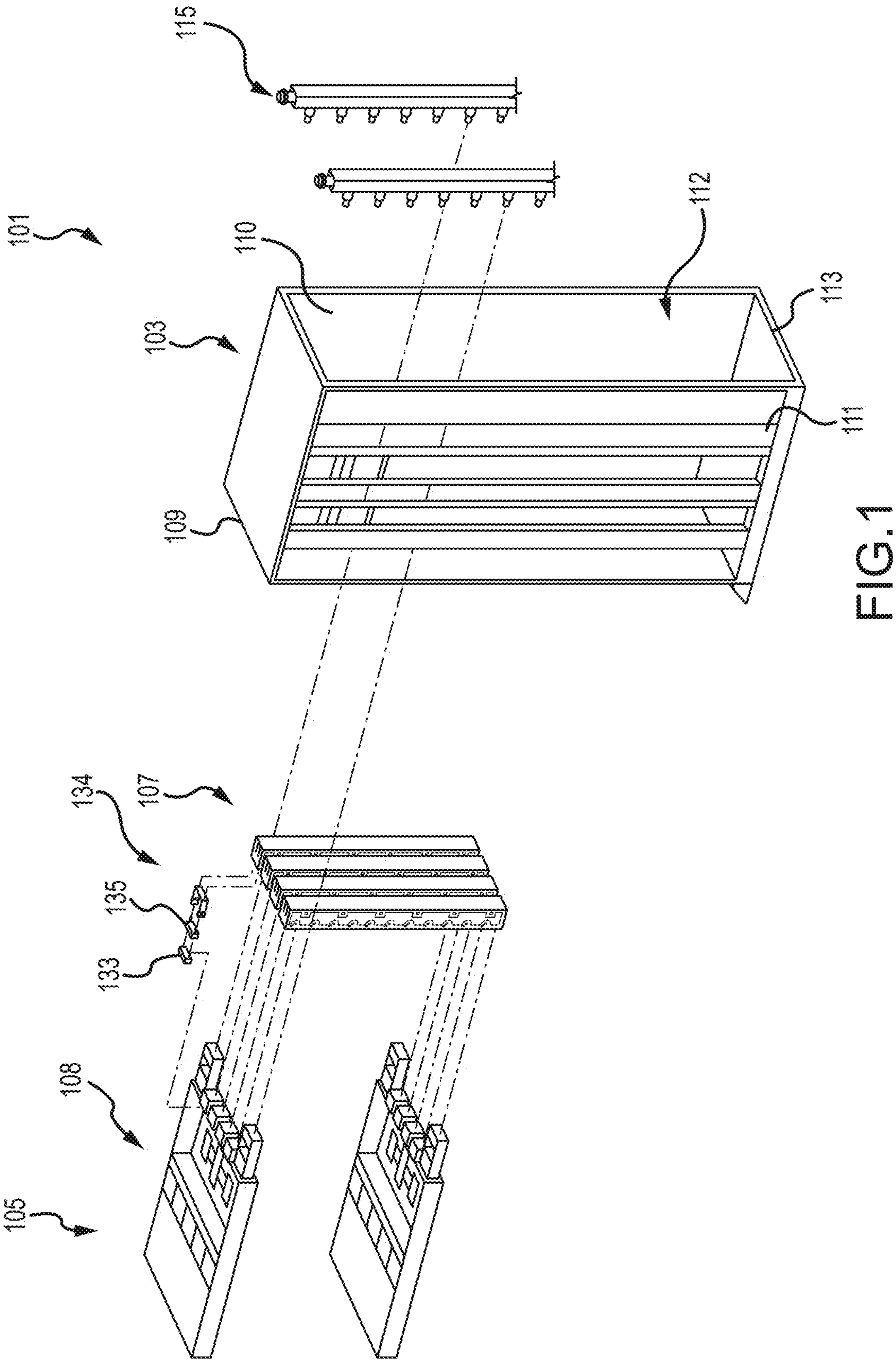
FIG. 1 is a perspective view of a rack and associated components that may be used within a datacenter according to various embodiments.

Embodiments herein are directed to connection structures and associated components for computing equipment, such as may be used in computer networks for data centers or other locations. The connection structures can include cartridges that can be installed relative to racks bearing appliances such as computing sleds, switch sleds, and/or other computing devices and/or networking hardware components.

The cartridges can facilitate rapid installation and connection of the appliances to one another within the rack. The cartridges can be installed within the rack and may include connectors aligned along the cartridge, such as along the front of the cartridge. Ports of the appliances may be engaged with the connectors of the cartridges. For example, the rack may be arranged to receive the appliances above one another so that ports in the appliances are aligned vertically to be able to engage with vertically aligned connectors of the cartridge. Thus, installing the appliances (such as by translating the appliances toward the cartridge) can allow the connectors of the cartridge to engage one or more ports of different appliances to establish connection among the received appliances. For example, cabling within the cartridge can provide interconnection between different subsets of the ports to enable transmission of data signals back and forth.

The appliances may be received via rails or other structure in the rack and may exhibit variations within a particular tolerance of resulting positioning of the ports of the appliances within the rack (e.g., being forward or rearward by differing amounts from a reference plane within the rack, or otherwise varying from a reference feature). Similarly, the cartridge may be secured in the rack by tracks or other structure in the rack and may also exhibit differences within an amount of tolerance of corresponding positioning within the rack. Tolerances may stack or build upon one another with progression from a lower portion of the cartridge to an upper portion of the cartridge and may result in non-negligible variation in relative positioning of received ports and connectors. To this end, the cartridges can include adjustment assemblies that can permit adjustments of positioning of the connectors relative to the cartridge to accommodate position variations from differences within tolerances and/or allow fine control of extents of mating between the connectors of the cartridge with the ports of the appliances.

Adjustment assemblies can include one or more screws, bolts, or other adjustable fasteners within the cartridge. For example, the cartridge may include an opening through rear or other portion of a body of the cartridge to permit access of a driver or other tool to reach and manipulate a given fastener to provide adjustment. The fastener may extend through flanges or other extensions of a bracket that may be c-shaped or otherwise suitably shaped to be positioned around cabling within the cartridge or to otherwise receive and/or not interfere with the cabling. Adjusting the fastener may adjust a position of the fastener within a slider to move the slider and impart movement from the slider to a body of an associated connector. A spring or other biasing member may be received in the slider or otherwise suitably positioned to allow adjusting of the fastener to adjust a compressed length of the biasing member or otherwise modulate a force that the biasing member may exert against the connector. Overall, adjusting the fastener may accordingly adjust a position of the connector body relative to the cartridge, such as to move the connector into more complete engagement with a port body on the appliance than may be present when the appliance and the cartridge are initially installed in the rack with a preliminary engagement that may be limited due to variations and/or stacking in tolerances along the cartridge.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Turning now to the figures, FIG. 1 depicts an assembly or system 101. The system 101 can include a rack 103, appliances 105, and cartridges 107. Two different appliances 105 are shown in FIG. 1, although more, fewer, and/or other types may be utilized. Generally, the appliances 105 can be received or situated at least partially within the rack 103, and the cartridges 107 can be installed in coupling engagement with the appliances 105 to provide interconnection among the appliances 105, such as for transfer of data, power, or other signals. During installation, the cartridges 107 may be mounted to the rack 103, such as within or along the rack 103. The mounting may be direct or via intervening structure, such as cross bars, sleds, or other stationary or movable members.

The rack 103 maybe a server rack or other equipment rack, such as may be prevalent in information technology or other data center contexts or environments. The rack 103 can include suitable structure for supporting appliances 105 and associated components. For example, metal or other suitably load-bearing material may be implemented in columns, beams, panels, or other suitable structures, which may include the structure for mounting the cartridges 107. Structure of the rack 103 can be coupled by bolts, screws, or any other suitable fasteners or fastening technique (including, but not limited to, welding, adhesives, or mechanical fasteners). The appliances 105 may be slidably received within the rack 103, such as along rails or other tracks (which are omitted for the sake of clarity in FIG. 1). For example, the rails or other tracks may be mounted between uprights and/or on or along a side panel 110, one of which is visible by way of example at right in FIG. 1 and one of which is removed from view at left in FIG. 1 for ease of viewing an interior volume 112 within the rack 103.

The rack 103 can be at least partially defined by a frame 109. The frame 109 can include structure that may define boundaries or other features of the rack 103. For example, the frame 109 may define outer edges of a footprint or outer perimeter of the rack 103. In use, the cartridge 107 may be received wholly within the footprint, outer perimeter, and/or interior volume 112 of the rack 103, e.g., to facilitate receipt of appliances 105 relative to the cartridge 107. Additionally or alternatively, the cartridge 107 may be received along the rack 103, such as at least partially outside the footprint, outer perimeter, and/or interior volume 112 of the rack 103.

The frame 109 can include uprights 111 (which may be generally vertically arranged and/or correspond to vertical uprights). The uprights 111 may be coupled together with transverse members 113. In contrast to the uprights 111 that may be generally vertically arranged or otherwise extend in or along a height direction, the transverse members 113 may be generally horizontally arranged or otherwise extend in or along one or more directions other than the height direction. For example, the transverse members 113 may run left-right or otherwise in or along a width direction and/or may run forward-backward or otherwise in or along a depth direction.

Additionally, although the cartridges 107 are depicted as extending along a partial height of the rack 103 for ease of viewing, the system 101 may additionally or alternatively include cartridges 107 of greater or lesser height, such as half-height cartridges 107 and/or cartridges 107 that may correspond to (or exceed or be less than) some other whole or partial portion of the full height of the rack 103 or associated component. Moreover, although four cartridges 107 are shown in FIG. 1, more or fewer may be utilized, including any number of one or more.

A given cartridge 107 can include sub-features that can facilitate engagement with sub-features of the rack 103 and/or with sub-features of the appliances 105. For example, suitable latching interfaces and/or other features may be included to allow the cartridge 107 to be secured in the rack 103 (e.g., before or after engagement of the cartridge 107 with the appliances 105).

The appliances 105 can include suitable components for computer servers, network hard drive components, network switches, or other network hardware components or other appliance for a data center or other environment. In some embodiments, the appliances 105 may correspond to a single type of component (e.g., all compute cards or all switch cards) or may include combinations of different types of components (e.g., some compute cards and some switch cards).

The appliances 105 may include or be included in any suitable number and/or form factor of chassis 108, including, but not limited to server chassis, switch chassis, etc. The chassis 108 may include trays and/or other suitable structure for containing or supporting other components and/or may include or be coupled with suitable rails or other structures for mounting within the rack 103. Moreover, although the appliances 105 are each shown with a same length and form of chassis 108 for purposes of illustration in FIG. 1, like or different lengths and/or form factors of chassis 108 may be utilized across different appliances 105 in use. Examples of components that may be included within a chassis 108 of a given appliance 105 include a printed circuit board, a fan, a solid state drive (SSD), a hard disk drive (HDD), a graphics processing unit (GPU), a heat sink, a cable, a connector, an interface, and/or other elements that may contribute to the operability of the appliance 105. Although listed individually, any of such components may be present singly or in multiples (or absent).

In use, the cartridges 107 may provide interconnection among the appliances 105 and/or connections between the appliances and additional components, including components external to the rack 103. The appliances 105 may be translated toward the cartridge 107 for installation (such as before or after installation of the cartridge 107 into the rack 103) and/or the cartridge 107 may be translated toward the appliances (such as before or after installation of the appliances 105 into the rack 103). Components may be arranged to facilitate installation around or past other components such as coolant manifolds 115, power supplies, and/or other structures that may be arranged along a rear or other location of the rack 103. In use, components may be installed relative to the rack 103 and received and/or receivable within the rack 103.

Some components that may facilitate engagement between the appliances 105 and the cartridge 107 are shown in exploded view in FIG. 1. For example, the appliances 105 can include port bodies 131 that may correspond to suitable structures of ports, while the cartridge 107 can include connector bodies 135 that may correspond to suitable structures of connectors. The connector bodies 135 in use may engage the port bodies 133 to provide connection between the appliances 105 and the cartridges 107.

The ports 133 can include any suitable form factor and may differ from or be alike to one another. The ports 133 may correspond to—or be compatible with—backplane structures, for example. In some examples, the ports 133 serve as at least a portion of a digital-to-analog converter (DAC). The ports 133 may correspond to any suitable form factor of pluggable module, pluggable media, pluggable transceiver, or other pluggable component. For example, the ports 133 may be sized and arranged to meet any suitable standard for pluggable optical transceivers. In one non-limiting example, one or more of the ports 133 may correspond to a small form-factor pluggable (SFP) transceiver, such as is commonly used for telecommunication and/or data communications applications. In another non-limiting example, one or more of the ports 133 comprises an enhanced small form-factor pluggable (SFP+) transceiver or a compact small form-factor pluggable (CSFP) transceiver. In an additional non-limiting example, one or more of the ports 133 comprises an RJ45 connector or a similar connector. Further non-limiting examples may include QSFP, QSFP+, QSFP28, QSFP56, QSFP56-DD, OSFP, or other standards that may be known in the art.

The ports 133 can be arranged so that the ports 133 are vertically aligned, aligned in columns or rows, or otherwise aligned between different appliances 105. Although the example in FIG. 1 depicts each appliance including only one in a series of vertically aligned ports 133, aligned ports 133 may be distributed across appliances 105 in any suitable manner. Any appliance 105 may include any suitable number of one or more of the aligned ports 133, and appliances 105 may differ or be alike in number of the aligned ports 133 included. The ports 133 can provide interfaces for connection and transfer of data or other electrical or optical signals or other varieties of signals.

The connectors 135 of the cartridge 107 can include suitable structure for engaging the ports 133. For example, the connectors 135 and the ports 133 can correspond to opposite mating components of a connection interface that are sized and arranged for engaging one another. The connection interface can facilitate blind-mate engagement, for example. Any suitable male and female portions of the connection interface may be included among the connectors 135 and ports 133. For example, although figures herein primarily depicts connectors 135 having projections or pins insertable into receptacles such as holes or pin-holes in the ports 133, either or both of the port 133 and connector 135 may include some protruding structure that is receivable within an opening, may include an opening or other suitable complementary structure suitable for receiving a protrusion from a mating component, or may include some combination of protrusion and receiving structure. As a further illustrative example, although the arrangements depicted in FIG. 1 is shown with ports 133 that appear substantially flush with a rear face defined by the appliances 105, ports 133 may additionally or alternatively include structure that is recessed into and/or projecting out from the appliances 105. Similarly, although the connectors 135 may be arranged projecting from the cartridge 107, connectors 135 may additionally or alternatively include structure that is flush and/or recessed relative to the cartridge 107.

In use, installation can include positioning the cartridge 107 along and/or within the interior volume 112 of the rack 103, along with previously, subsequently, or simultaneously positioning appliances 105 at least partially within the interior volume 112 of rack 103. As part of installation, the connector body 135 and the port body 133 may be moved toward each other, such as by imparting relative motion between the cartridge 107 and the appliances 105. The relative motion may include the cartridge 107 being moved toward appliances 105 already installed in the rack 103 and/or may include the appliances 105 being moved toward the cartridge 107 already installed in the rack 103, for example. The relative motion may include forward movement of the cartridge 107 and/or backward movement of the appliances 105, although some degree of vertical translation (e.g., in addition to or as an alternative to horizontal translation) may be utilized to facilitate engagement between the cartridge 107 and the appliances 105. For example, the cartridge 107 may be moveable up or down as part of engaging with the appliances 105, and/or a given appliance 105 may be moveable up or down as part of engaging with the cartridge 107.

Relative motion between the cartridge 107 and the appliances 105 may bring the cartridge 107 and the appliances 105 into an initially installed state. For example, in the initially installed state, the port bodies 133 of the appliances 105 may be in preliminary engagement with the connector bodies 135 of the cartridge 107. However, in the initially installed state, connector bodies 135 at different positions along the cartridge 107 may be engaged by differing amounts with corresponding port bodies 133, such as due to differences within tolerances. Thus, it may be useful to be able to adjust a positioning of the connector body 135 after installation to modulate an extent of mating with a corresponding port body 133 in use.

To this end, the cartridge 107 can further include an adjustable assembly 134 (which alternatively may be termed an adjustment assembly 134). The adjustable assembly 134 may facilitate adjustment of the connector body 135 relative to the cartridge 107 and/or a portion of the appliance 105 (such as the port body 133). For example, the adjustable assembly 134 may enable altering an extent of mating of a given connector body 135 with a given port body 133 from a first extent of mating present at the preliminary engagement to a second extent different from the first extent so as to accommodate variations in positioning of the connector bodies 135 and the port bodies 133 along the height of the cartridge 107 in the initially installed state. The adjustable assembly 134 can include components that may be more readily shown or appreciated in FIG. 2A, for example.

Figure 2A:
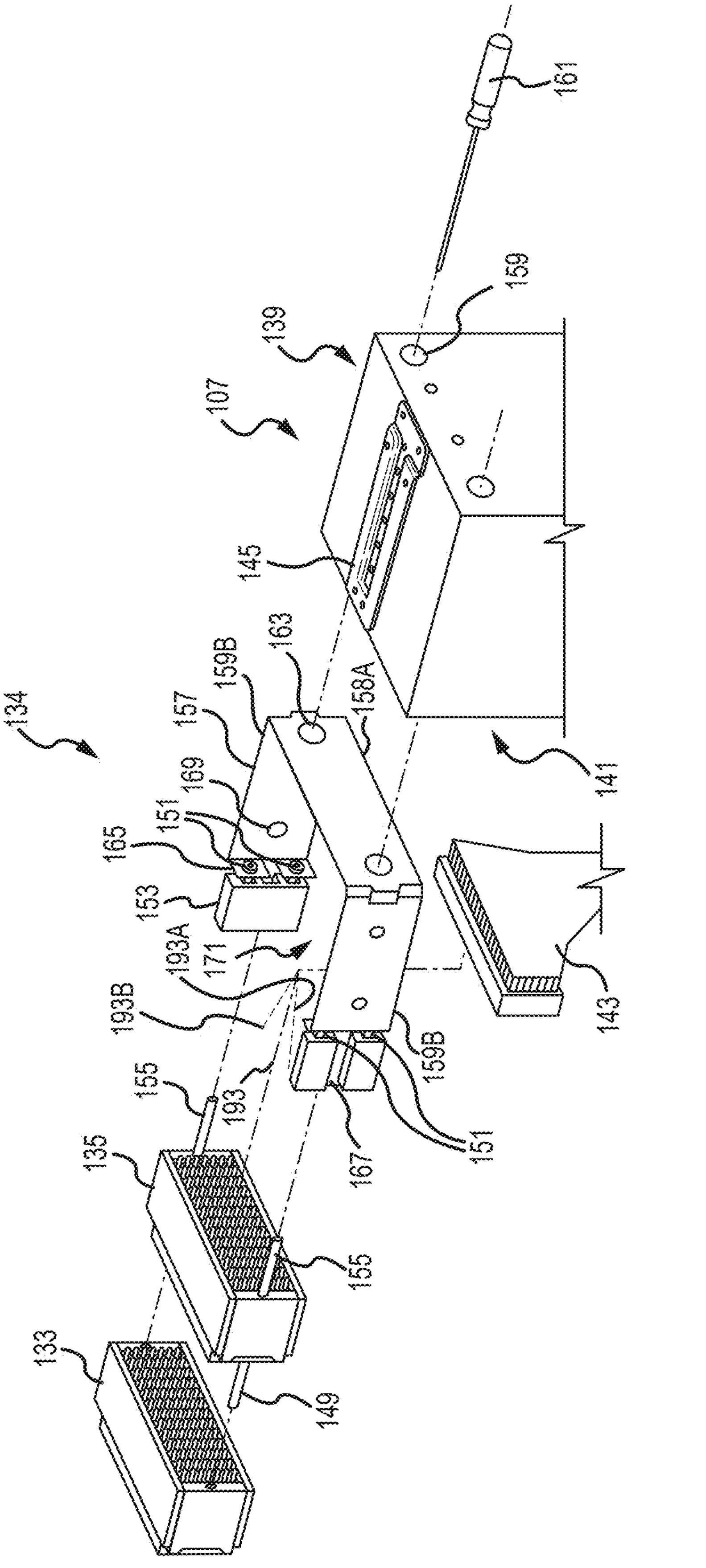
FIG. 2A is an exploded view of an example of various components that may be implemented relative to a cartridge that may be utilized with the rack of FIG. 1 according to various embodiments.

FIG. 2A illustrates an exploded view of various components that may be included with the cartridge 107 and/or other associated elements in use. The adjustable assembly 134 in use may be coupled with at least one connector body 135 of the cartridge 107, such as to facilitate adjustment relative to a port body 133 (e.g., which may be included in an appliance 105, such as in FIG. 1).

As may be appreciated with reference to FIG. 2A by way of example, various features may be implemented relative to a body 139 of the cartridge 107. For example, the connectors 135 may be distributed along a body 139 of the cartridge 107. The body 139 may include a casing or shell formed of metal, plastic, or some other suitable material for the body 139 to be rigid, elongate, and/or upright during use. The body 139 may be hollow or tube-like, for example.

The body 139 of the cartridge 107 may define an internal volume 141. In various examples, the connector bodies 135 and/or features of the adjustment assembly 134 can be incorporated into and/or may be at least partially present within the internal volume 141 of the cartridge 107.

Cabling 143 can be included in the internal volume 141. As non-limiting examples, the cabling 143 may include copper, glass, or other materials suitable for transmission of appropriate signals therethrough. The cabling 143 may correspond to any suitable type of cable including, but not limited to, electrical cable (e.g., formed with copper or other electrically conductive cores), fiber optic cables (e.g., formed with a glass or other light-transmitting core), or other types. Generally, the cabling 143 can include suitable wiring, optical fibers, and/or other conduits for transmitting electrical power, data, and/or other signals there through. Although the cabling 143 and associated components depicted and described herein may be particularly suited for optical transmissions, in some aspects, the cabling 143 may be replaced with and/or include a conduit for other connection types, in addition or as alternatives, such as connections for acoustic communication, fluid communication, and/or electrical communication.

The cabling 143 can include individual cables that may be coupled at one end to a respective connector 135 and routed through the body 139 of the cartridge 107. Multiple cables of the cabling 143 may be connected with a particular connector 135 and may be bundled or otherwise appropriately arranged to facilitate connection with different lanes or channels enabled by the connector 135. Any suitable combination or routing of cabling 143 may be utilized to provide interconnection among subsets of the connectors 135.

The cabling 143 may establish signal paths between respective pairs of the connectors 135 and/or associated ports 133, for example. The cartridge 107 is not limited to the number of connectors 135 shown, but may include fewer or more and/or different spacing or clustering as fits a particular scenario. Generally, any number of two or more connectors 135 can be included on a cartridge 107 to provide a suitable connection between a corresponding arrangement of appliances 105. The routing of the cabling 143 within the cartridge 107 may permit connection between different subgroups of connectors 135. In addition, the cabling 143 may include arrangements of cabling 143 in which many-to-one, one-to-many, or many-to-many arrangements are enabled by the cabling 143.

The body 139 of the cartridge 107 may include suitable mounting structure 145 in use. The mounting structure 145 is depicted as a rail that may latch onto a suitable cross bar or other member of the rack 103 in use, although any track, clamp, and/or other suitable structure for securing the cartridge 107 relative to the rack 103 may be utilized. The mounting structure 145 may secure the cartridge 107 in an initially installed position from which it may be useful to have adjustment of positioning of the connector 135 relative to the body 139 of the cartridge 107, such as may be provided by the adjustment assembly 134.

The adjustment assembly 134 can include a series of components that may facilitate adjustability of positioning of the connector bodies 135 in use. For example, the adjustment assembly 134 may be suitable for adjusting a positioning of an alignment post 149 and/or other structure of the connector body 135 for suitably engaging with the port body 133.

In the view shown in FIG. 2A, the adjustment assembly 134 may include a set of one or more fasteners 151. Although more than one may be implemented, for ease of discussion, a single fastener 151 will primarily be referenced.

The fastener 151 may be adjustable to adjust the position of the connector body 135 relative to the rigid body 139 of the cartridge 107 in operation. The fastener 151 in FIG. 2A is shown implemented relative to a slider 153, biasing member 155 (e.g., which may correspond to a spring or other biasing element that may be capable of exerting a biasing force in use), and a bracket 157, although more, fewer, and/or different elements may be utilized.

The body 139 of the cartridge 107 can include at least one opening 159. The opening 159 is shown on a rear of the cartridge 107, for example. The opening 159 may be suitably sized and positioned for receipt or passage of a tool 161. The opening 159 may be positioned for insertion of the tool 161 to access at least one of the fasteners 151 in use. For example, with the preliminary engagement established, installation may include inserting the tool 161 into an inserted configuration in which the tool 161 is extending through the opening 159 in the rear of the cartridge 107. The opening 159 can be aligned with an aperture 163 in the bracket 157, for example. In operation, the tool 161 may extend through the opening 159 in the body 139 of the cartridge 107 and through the aperture 163 in the bracket 157 to reach and engage the fastener 151. The adjustment assembly 134 can be operated so that manipulating the fastener 151 will cause adjustment of positioning of the connector body 135. For example, with the tool 161 in the inserted configuration, operations may include using the tool 161 for adjusting positioning of a set of one or more fasteners 151 so as to impart adjusting with the adjustment assembly 134.

The bracket 157 may include a suitable combination of components. The bracket 157 may include a base 158A. One or more extensions 159B may extend from the base 158A. For example, the extensions 159B may each extend forward from opposite ends of the base 158A or otherwise from a same side of the base element 158A. The bracket 157 may include a c-shaped form factor. The extensions 159B may correspond to left and right arms of the c-shape, for example.

The bracket 157 may be configured for holding the fasteners 151 and/or may be a structure in which the fasteners 151 are received. The bracket 157 may include a flange 165. The flange 165 may be suitably shaped to receive a fastener 151 in use. The flange 165 may extend away from one of the extensions 159B, for example.

The bracket 157 may include mounting holes 169. The mounting holes 169 may correspond to threaded holes or other interfaces that may permit a suitable rivet, bolt, or other coupler to attach the bracket 157 to an interior of the cartridge 107.

The bracket 157 can include or define a pass-through volume 171 that may allow the cabling 143 to be routed in use. For example, the pass-through volume 171 may be sized to facilitate routing of the cabling 143 therethrough.

The slider 153 may be re-positionable by adjustment of the fastener 151 to adjust positioning of the connector body 135 relative to the body 139 of the cartridge 107. The slider 153 may correspond to a block that is suitably sized for engaging and/or interacting with other components. The slider 153 may include a passage 167 that may be suitably sized for receiving the biasing member 155. Various features and/or functions of the slider 154 and/or the biasing member 155 may be appreciated with respect to the views shown in FIGS. 2B, 3A, 3B, and 3C by way of example.

Figure 2B:
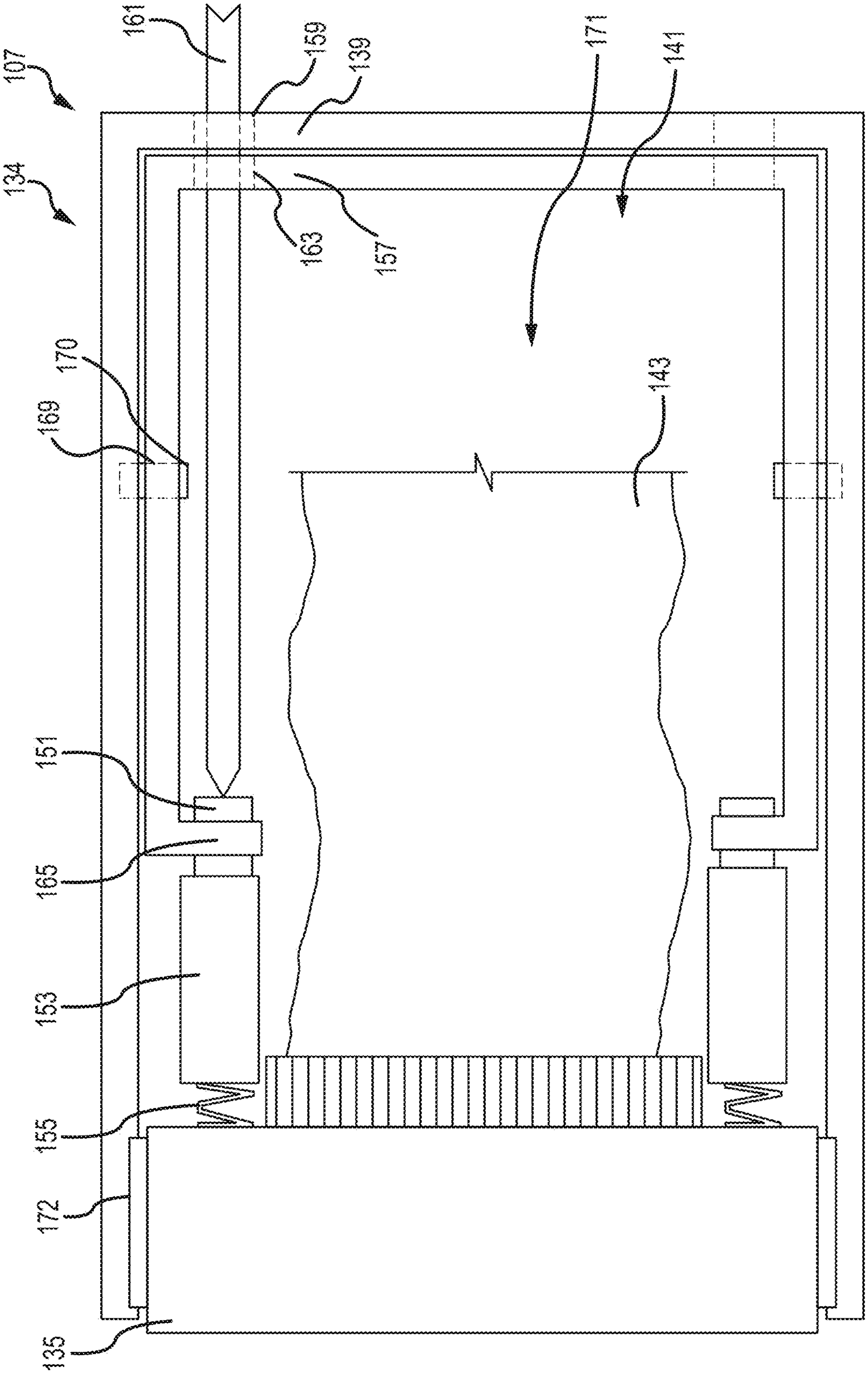
FIG. 2B is top view showing a tool inserted into a cartridge for engaging components from FIG. 2A according to various embodiments.

FIG. 2B is top view showing an example with various parts of the adjustment assembly 134 and associated features installed or otherwise within the internal volume 141 of the cartridge 107. For example, the bracket 157 is shown secured by examples of couplers 170 are shown extending through mounting holes 169 in the bracket 157 and into the body 139 of the cartridge 107 to secure the bracket 157 in the body 139 of the cartridge 107. The bracket 157 may be secured to be fixed to the body 139 of the cartridge 107, for example.

The connector body 135 may be installed so as to be moveable relative to body 139 of the cartridge 107. For example, the connector body 135 may be mounted on rails 172 or other tracks or structures that may enable the connector body 135 to move relative to the body 139 of the cartridge 107.

The bracket 157 may be positioned to align the opening 159 in the cartridge 107 with the aperture 163 in the bracket 157, e.g., to permit the tool 161 to reach the fastener 151. For example, FIG. 2B may correspond to an example of the tool 161 in an inserted configuration for engaging the fastener 151. In the inserted configuration, the tool 161 may be extending through the opening 159 in the cartridge 107 and/or the aperture 163 in the bracket 157, for example. The tool 161 may be engaged with the fastener 151 to cause manipulate the fastener 151 and alter states of the adjustment assembly, such as to enable shifting among positions depicted by way of example in FIGS. 3A, 3B, and 3C.

Figure 3A:
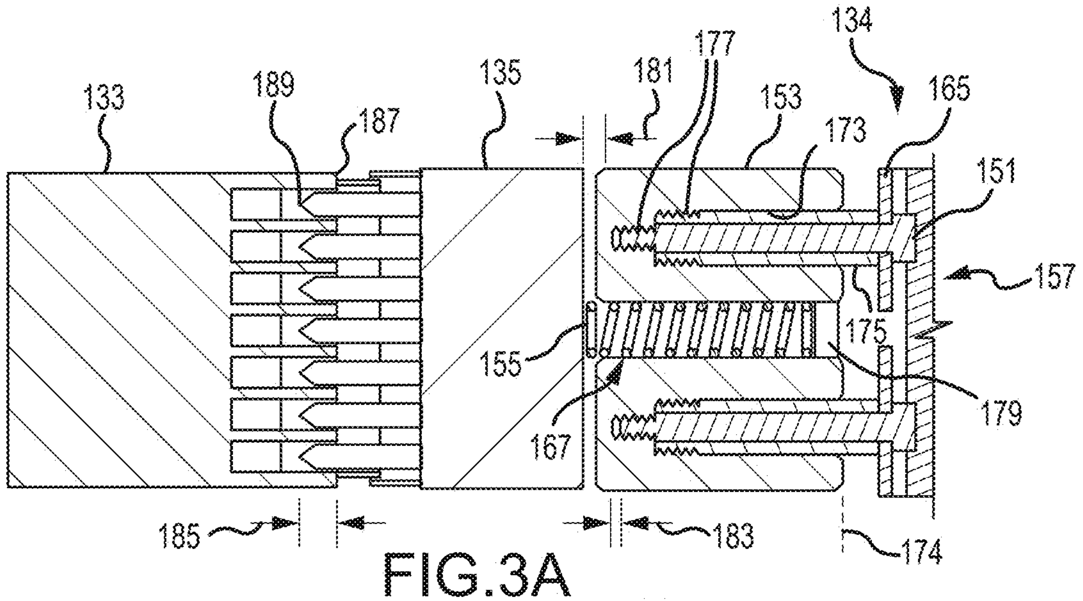
FIGS. 3A, 3B, and 3C illustrate side cutaway views of examples of differing states of various components that may be utilized with the cartridge of FIG. 2A according to various embodiments.
Figure 3B:
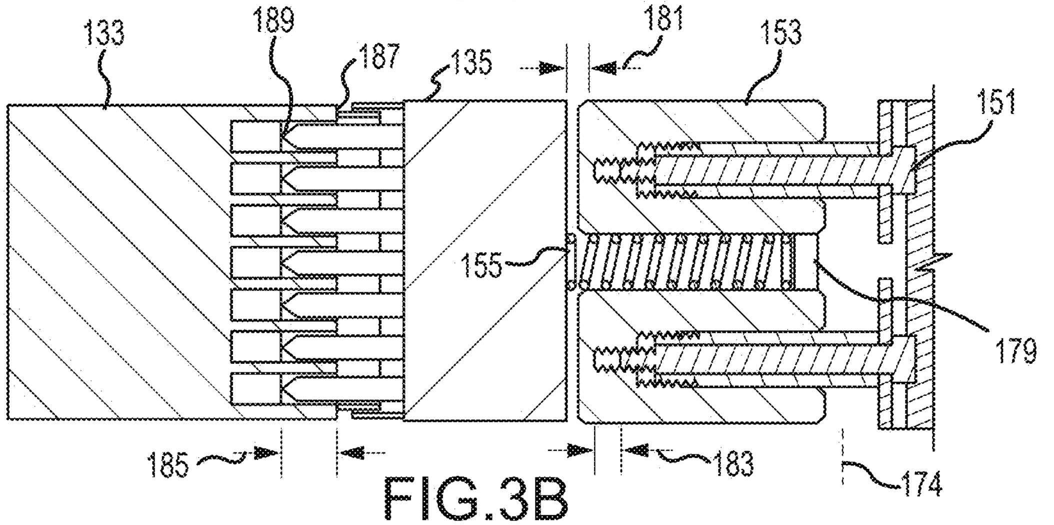
Figure 3C:
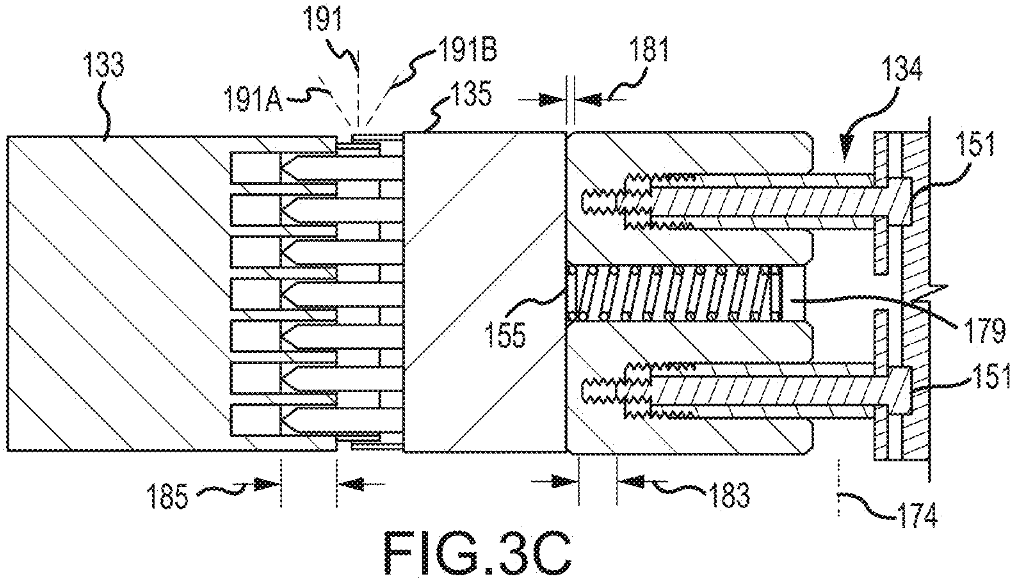

FIGS. 3A, 3B, and 3C illustrate side cutaway views of examples of differing states of parts of the adjustment assembly 134 and associated features. For example, FIGS. 3A, 3B, and 3C show different states with the bracket 157, the fastener 151, the slider 153, the biasing member 155, the connector body 135, and the port body 133. Generally, the fastener 151 may be suitably arranged to allow adjustment of positioning of the connector body 135 in use. The positioning of the connector body 135 may be adjusted by the adjustment assembly 134 to allow adjustment relative to the port body 133 in use. Moreover, although a single connector body 135 is depicted, a given set of one or more fasteners 151 may be used to adjust positioning of one or more connector bodies 135, including arrangements in which adjusting an individual fastener 151 may affect positioning of a set of multiple connector bodies 135, such as arranged over one another, alongside one another, or in other relative arrangement.

FIG. 3A shows various features that are also repeated in FIGS. 3B and 3C with some changes in positioning. The fastener 151 may be arranged extending through the flange 165 in the bracket 157. The flange 165 may include or provide a suitable seat at which the fastener 151 may turn, rotate, or otherwise move to facilitate adjustment. For example, the flange 165 may include a through-hole that receives the fastener 151.

The fastener 151 may be arranged extending into the slider 153. The slider 153 may include at least one bore 173. The bore 173 may be sized for receiving the fastener 151. The bore 173 further may be sized for receiving a bushing 175.

The bushing 175 may be suitably sized for maintaining alignment of the fastener 151 within the bore 173 of the slider 153. For example, the bushing 175 may extend radially between an outer diameter or periphery of the fastener 151 and an inner diameter or periphery of the bore 173. The bushing 175 may be suitably sized for maintaining an axial positioning of the fastener 151. For example, the bushing 175 may be secured to the outer diameter or periphery of the fastener 151 and extend a suitable distance toward a head of the fastener 151 to sandwich the flange 165 between the bushing 175 and the head of the fastener 151 so that the fastener 151 is retained in a suitable position along the longitudinal axis while being able to rotate along the longitudinal axis.

Threaded surfaces 177 may be included on the fasteners 151 (e.g., on a tip) and/or on the bushing 175 (e.g., on an outer diameter or periphery). The threaded surfaces 177 may be engageable with threads in the bore 173, for example. The threaded surfaces 177 may allow the fasteners 151 to relocate or reposition the slider 153 in use, such as in response to manipulation of the fastener 151 by the tool 161 (FIG. 2A). For example, the slider 153 may start in alignment with a reference face 174 (e.g., as in the position shown in FIG. 3A) and may begin to move away from the reference face 174 (e.g., to a position shown in FIG. 3B) and/or may continue to move away from the reference face 174 (e.g., to a position shown in FIG. 3C).

The biasing member 155 may be received within the passage 167 in use. The passage 167 may include a stopper 179. The stopper 179 may correspond to a cap or blind hole end within or for the slider 153 or other suitable structure for allowing the biasing member 155 to press again the slider 153. Although the stopper 179 is shown as a discrete component relative to other structure of the slider 153, the stopper 179 may additionally or alternatively correspond to a structure integrally-formed with the slider 153.

The biasing member 155 may be attached or coupled to the stopper 179 on one end and the connector body 135 on an opposite end in some implementations. Attachment at both ends may allow the biasing member 155 to impart relative movement in opposite directions, such as to push the connector 135 when the biasing member 155 is pushed toward the connector body 135 and/or to pull the connector 135 when the biasing member 155 is pulled away from the connector body 135.

Relative distances between components may change in use. FIG. 3A denotes some examples.

As a first example, the slider 153 and the connector body 135 may be positioned separated by a spaced distance 181. For example, the biasing member 155 may be sized and configured in an equilibrium state to hold the slider 153 and the connector body 135 apart. Additionally or alternatively the biasing member 155 may be compressible to impart or adjust a biasing force for biasing the connector body 135 away from the slider 153 and/or toward the port body 133. A magnitude of the biasing force against the connector body 135 may be adjustable by adjustment of the fastener 151, for example.

As a second example, an unthreaded distance 183 may exist between an end of the fastener 151 and an end of the bore 173. The unthreaded distance 183 additionally or alternatively may correspond to an amount of the bore 173 that is not occupied by the threaded surface 177 on the fastener 151 and/or bushing 175.

As a third example, an engagement and/or extension distance 185 may be present and may correspond to an extent of engagement between structure of the connector body 135 and the port body 133. For example, the extension distance 185 may correspond to an amount that a terminus 189 or furthest extreme of structure of the connector body 135 extends into and/or past a front edge 187 (or other edge or reference surface) of the port body 133 or vice versa.

FIG. 3A may represent an example of an initially installed state (e.g., which may result from installation including relative motion between the cartridge 107 and the appliances 105 (FIG. 1). For example, the port body 133 may be in preliminary engagement with the connector body 135. The preliminary engagement may be quantified by the extension distance 185, for example. In operation, the adjustment assembly 134 may be utilized to further facilitate increased (or otherwise adjusted) engagement of the connector body 135 and the port body 133, such as to reach one or more of the states represented in FIG. 3B and/or FIG. 3C.

In operation, manipulating the fastener 151 (e.g., via the tool 161 of FIG. 2A) may rotate the threaded surfaces 177, which may alter the unthreaded distance 183. For example, the unthreaded distance 183 may be increased, such as to shift from the state shown in FIG. 3A to the state shown in FIG. 3B. Increasing the threaded distance may the cause the slider 153 to advance (e.g., move leftward in the depicted views, such as moving from the position in FIG. 3A to the position shown in FIG. 3B). Advancing the slider 153 may press the stopper 179 against the biasing member 155. Pressing the biasing member 155 may compress the biasing member or otherwise cause the biasing member 155 to in turn impart a biasing force against the connector 135. If the biasing force applied against the connector 135 by the biasing member 155 exceeds a resistance force from the port body 133 (e.g., which may be related to friction, misalignment, and/or other factors), the biasing member 155 may accordingly impart motion to the connector body 135 and cause a change in the extension distance 185 (e.g., causing the front edge 187 of the port body 133 to be passed by the terminus 189 of the connector body 135 by a greater amount of extension distance 185 in FIG. 3B than in FIG. 3A).

The spaced distance 181 between the slider 153 and the connector body 135 may vary during compression of the biasing member 155 and/or may equalize or move toward equilibrium when the biasing force available from the biasing member 155 exceeds resistance force from the port body 133. Accordingly, the spaced distance 181 between the slider 153 and the connector body 135 is depicted in FIG. 3B with a similar length as in FIG. 3A. Similarly, the biasing member 155 is depicted in FIG. 3B with a similar length as in FIG. 3A, which may correspond to having expended the biasing force from compressing in having moved the connector body 135 to alter the extension distance 185.

Altering the extension distance 185 may correspond to and/or enable control of an amount of mating or de-mating in use. For example, in some embodiments, the adjustment assembly 134 may enable mating or de-mating within a precise range, such as corresponding to 0.2 mm or less instead of between 1 millimeter or 2 millimeters or other range that may be reliably accomplished by preliminary engagement absent the adjustment assembly 134.

Establishing mating or de-mating within a precise range may enable reduction or elimination of signal loss and/or may enable reliable data transfer at increased transmission speeds.

FIG. 3B generally depicts that the biasing member 155 may drive the connector body 135 when additional mating or de-mating is available. FIG. 3C in contrast also generally depicts that the biasing member 155 may compress and/or permit a change in the spaced distance 181 between the slider 153 and the connector body 135 when additional mating or de-mating is unavailable.

To this end, FIG. 3C shows a different condition in which biasing force from the biasing member 155 may be insufficient to further engage the connector body 135 with the port body 133 (e.g., because the connector body 135 may already be fully engaged with the port body 133). The extension distance 185 in FIG. 3C is shown without change from FIG. 3B, which may connote an engagement of the port body 133 with the connector 135 that is sufficiently profound to not permit additional force asserted by additional compression of the biasing member 155 to further drive the connector body 135 further into engagement with the port body 133. As a result, further manipulation of the fastener 151 (e.g., increasing the unthreaded distance 183, such as to the extent shown in FIG. 3C from either the extent shown in FIG. 3A or FIG. 3B) may further advance the slider 153. Such advancing of the slider 153 when the port body 133 is resisting or preventing further movement of the connector body 135 may cause the biasing member 155 to compress (e.g., in lieu of and/or without imparting a corresponding movement of the connector body 135). As such, the biasing member 155 is shown at a reduced or compressed length in FIG. 3C that is less than in FIG. 3A or FIG. 3B. Additionally or alternatively, compression of the biasing member 155 and/or resistance from the port body 133 may cause a reduction in—and/or an elimination of—the spaced distance 181 between the slider 153 and the connector body 135 (e.g., moving from the size depicted in FIG. 3A or FIG. 3B to the size depicted in FIG. 3C).

In operation, the adjustment assembly 134 additionally or alternatively can be utilized to reduce available biasing toward engagement. For example, the fastener 151 may be reversed (e.g., which may move from a state shown in FIG. 3C toward a state shown in FIG. 3B or in FIG. 3A and/or beyond). Reversing manipulation of the fastener 151 may impart a pulling of the biasing member 155 (e.g., via connection with the stopper 179 and the connector 135). Pulling the biasing member 155 (e.g., rightward in the depicted views) may begin to retract the connector body 135 (such as upon reaching the state shown in FIG. 3A in a reverse sequence to previously described).

The inclusion of multiple fasteners 151 at different positions relative to one another can allow adjustment of aligning of a direction of force from the biasing member 155. For example, as may be appreciated with respect to at least FIG. 3C, the fasteners 151 can include least one upper fastener 151 vertically spaced from a lower fastener 151. The fasteners 151 in such situations may cause and/or adjust an extent of a forward tilt 191A or a backward tilt 191B from a vertical axis 191. Additionally or alternatively, as may be appreciated with respect to at least FIG. 2A, the fasteners 151 may include fasteners 151 that are spaced laterally from one. For example, in the view in FIG. 2A, the fasteners 151 at left and right maybe adjusted by different amounts in order to provide different amounts of lateral tilt 193A and/or 193B from a central or longitudinal axis 193. In various examples, including fasteners 151 that are spaced along both vertical and lateral axes (such as with the four shown in FIG. 2A) can allow suitable re-orientation of the biasing member 155 and/or other element of the adjustment assembly 134 to permit accommodating any form of misalignment in any three-dimensional direction that may be present between the connector body 135 and the port body 133.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method of installing computing equipment, the method comprising:

positioning a cartridge within an interior volume of a server rack, the cartridge comprising connector bodies distributed at respective vertical positions along a height of the cartridge;

positioning multiple server chassis at least partially within the interior volume of the server rack;

imparting relative motion between the cartridge and the multiple server chassis to bring the cartridge and the multiple server chassis each into an initially installed state in which port bodies of the multiple server chassis are in preliminary engagement with the connector bodies of the cartridge;

with the preliminary engagement established, inserting a tool into an inserted configuration in which the tool is extending through an opening in a rear of the cartridge; and with the tool in the inserted configuration, using the tool for adjusting positioning of a set of one or more fasteners so as to impart adjusting of a compressed length of a spring arranged in the cartridge relative to a given connector body of the connector bodies, wherein said adjusting of the compressed length of the spring alters an extent of mating of the given connector body with a given port body of the port bodies from a first extent of mating present at the preliminary engagement to a second extent different from the first extent so as to accommodate variations in positioning of the connector bodies and the port bodies along the height of the cartridge in the initially installed state.

2. The method of claim 1, wherein the using the tool for adjusting positioning of the set of one or more fasteners comprises using the tool for adjusting relative positioning among at least one upper fastener and at least one lower fastener vertically spaced from the at least one upper fastener so as to alter an extent of forward or backward tilt of alignment of a direction of force applied by the spring.

3. The method of claim 1, wherein the using the tool for adjusting positioning of the set of one or more fasteners comprises using the tool for adjusting relative positioning among at least one first lateral fastener and at least one second lateral fastener laterally spaced from the at least one first lateral fastener so as to alter an extent of lateral tilt of alignment of a force applied by the spring.

4. The method of claim 1, wherein the using the tool for adjusting positioning of the set of one or more fasteners comprises using the tool for adjusting relative positioning among at least one upper fastener and at least one lower fastener and among at least one first lateral fastener and at least one second lateral fastener so as to alter an extent of forward or backward tilt and an extent of lateral tilt of alignment of a direction of force applied by the spring.

5. A system, comprising:

a rack comprising a frame defining an interior volume of the rack;

a plurality of appliances receivable at least partially within the interior volume of the rack, the appliances having port bodies; and a cartridge receivable in or along the interior volume of the rack and comprising:

an upright rigid body;

connector bodies arranged along the upright rigid body and engageable with the port bodies of the appliances;

cabling within the upright rigid body and providing paths among subsets of the connector bodies; and an adjustable assembly coupled with at least one connector body of the connector bodies and comprising a set of one or more fasteners adjustable to adjust a position of the at least one connector body relative to the upright rigid body.

6. The system of claim 5, wherein the upright rigid body comprises an opening positioned for insertion of a tool to access at least one fastener in the set of one or more fasteners.

7. The system of claim 6, further comprising the tool.

8. The system of claim 5, wherein the adjustable assembly further comprises a biasing member arranged to impart a biasing force against the at least one connector body.

9. The system of claim 8, wherein a magnitude of the biasing force is adjustable by adjustment of the set of one or more fasteners.

10. The system of claim 5, wherein the adjustable assembly further comprises a slider that is re-positionable by adjustment of the set of one or more fasteners to adjust positioning of the at least one connector body relative to the upright rigid body.

11. The system of claim 5, further comprising a bracket configured for holding the set of one or more fasteners and shaped to define a pass-through volume sized to facilitate routing of the cabling therethrough.

12. The system of claim 5, wherein:

the rack is a server rack;

the cartridge is positionable within the interior volume of the server rack;

the connector bodies are distributed at respective vertical positions along a height of the cartridge;

the appliances comprise multiple server chassis and are positionable at least partially within the interior volume of the server rack;

the cartridge and the appliances are configured for imparting relative motion therebetween to bring the cartridge and the appliances each into an initially installed state in which the port bodies of the appliances are in preliminary engagement with the connector bodies of the cartridge;

with the preliminary engagement established, a tool is insertable into an inserted configuration in which the tool is extending through an opening in a rear of the cartridge;

with the tool in the inserted configuration, the tool is usable for adjusting positioning of the set of one or more fasteners so as to impart adjusting of a compressed length of a spring arranged in the cartridge relative to a given connector body of the connector bodies; and said adjusting of the compressed length of the spring alters an extent of mating of the given connector body with a given port body of the port bodies from a first extent of mating present at the preliminary engagement to a second extent different from the first extent so as to accommodate variations in positioning of the connector bodies and the port bodies along the height of the cartridge in the initially installed state.

13. A system comprising a cartridge for installation within or along an interior volume of a rack and relative to appliances to be arranged in the rack such that port bodies of the appliances are linearly aligned along a first direction, the cartridge comprising:

an elongate rigid body;

connector bodies arranged along the elongate rigid body and sized for engagement with the aligned port bodies of the appliances; and an adjustable assembly coupled with at least one connector body of the connector bodies and comprising a set of one or more fasteners adjustable to adjust a position of the at least one connector body relative to the elongate rigid body.

14. The system of claim 13, further comprising cabling arranged within the elongate rigid body and routed to couple subsets of the connector bodies to one another.

15. The system of claim 13, further comprising at least one of the appliances or the rack.

16. The system of claim 13, wherein the set of one or more fasteners comprises at least one fastener at least one of vertically spaced or laterally spaced from another fastener in the set.

17. The system of claim 13, wherein the elongate rigid body comprises an opening positioned in alignment for access to at least one fastener in the set of one or more fasteners.

18. The system of claim 13, further comprising at least one of:

a biasing member arranged to impart a biasing force against at least one of the connector bodies; or a slider that is re-positionable by adjustment of the set of one or more fasteners to adjust positioning of at least one of the connector bodies relative to the elongate rigid body.

19. The system of claim 13, wherein:

the system comprises the rack;

the system comprises the appliances and the appliances are receivable at least partially within the interior volume of the rack;

the cartridge is receivable in or along the interior volume of the rack; and the system comprises cabling within the elongate rigid body and providing paths among subsets of the connector bodies.

20. The system of claim 19, wherein:

the rack is a server rack;

the cartridge is positionable within the interior volume of the server rack;

the connector bodies are distributed at respective vertical positions along a height of the cartridge;

the appliances comprise multiple server chassis and are positionable at least partially within the interior volume of the server rack;

the cartridge and the appliances are configured for imparting relative motion therebetween to bring the cartridge and the appliances each into an initially installed state in which the port bodies of the appliances are in preliminary engagement with the connector bodies of the cartridge;

with the preliminary engagement established, a tool is insertable into an inserted configuration in which the tool is extending through an opening in a rear of the cartridge;

with the tool in the inserted configuration, the tool is usable for adjusting positioning of the set of one or more fasteners so as to impart adjusting of a compressed length of a spring arranged in the cartridge relative to a given connector body of the connector bodies; and said adjusting of the compressed length of the spring alters an extent of mating of the given connector body with a given port body of the port bodies from a first extent of mating present at the preliminary engagement to a second extent different from the first extent so as to accommodate variations in positioning of the connector bodies and port bodies along the height of the cartridge in the initially installed state.

* * * * *